US010403770B2

(12) United States Patent
Wolfe et al.

(10) Patent No.: US 10,403,770 B2
(45) Date of Patent: Sep. 3, 2019

(54) CONDUCTIVE PASTE COMPOSITION AND SEMICONDUCTOR DEVICES MADE THEREWITH

(71) Applicant: E I DU PONT DE NEMOURS AND COMPANY, Wilmington, DE (US)

(72) Inventors: Michael Stephen Wolfe, Wilmington, DE (US); John Donald Summers, Chapel Hill, NC (US); Bryan Benedict Sauer, Wilmington, DE (US); Hoang Vi Tran, Wilmington, DE (US); Brian D Mather, Newark, DE (US); Hee Hyun Lee, Wilmington, DE (US); Esther Kim, Wilmington, DE (US); Ma Helen Cativo, Wilmington, DE (US); Yuefei Tao, Hockessin, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 15/015,245

(22) Filed: Feb. 4, 2016

(65) Prior Publication Data

US 2016/0225925 A1 Aug. 4, 2016

Related U.S. Application Data

(60) Provisional application No. 62/175,060, filed on Jun. 12, 2015, provisional application No. 62/112,030, filed on Feb. 4, 2015.

(51) Int. Cl.

*H01L 31/0224* (2006.01)
*C09D 5/24* (2006.01)

(Continued)

(52) U.S. Cl.

CPC ........ *H01L 31/022425* (2013.01); *C03C 8/16* (2013.01); *C03C 8/18* (2013.01);

(Continued)

(58) Field of Classification Search

CPC ....... H01L 31/022425; H01L 31/02168; C03C 17/3411; C03C 8/16; C03C 8/18;

(Continued)

(56) References Cited

U.S. PATENT DOCUMENTS 3,932,311 A 1/1976 Caldwell et al.
4,369,063 A * 1/1983 McGowan, Jr. ......... C09D 5/24 106/1.14

(Continued)

FOREIGN PATENT DOCUMENTS

CN 101037494 A 9/2007
CN 101560283 A 10/2009

(Continued)

OTHER PUBLICATIONS

International Search Report and Written Opinion dated May 27, 2016 for International Application No. PCT/US2016/016338.

(Continued)

*Primary Examiner* — Jeffrey T Barton
*Assistant Examiner* — Michael Y Sun

(57) ABSTRACT

A conductive paste composition comprises (i) an inorganic powder comprising at least a conductive powder, (ii) at least one microgel polymer, and (iii) a solvent. The paste composition may be used in a process for manufacturing an electrical device comprising: preparing a substrate; applying the conductive paste onto the substrate in a preselected pattern; and heating the applied conductive paste to form a conductive structure that provides an electrode for connecting the device. The paste composition beneficially permits the formation of narrow, high aspect ratio features in the conductive structure.

23 Claims, 2 Drawing Sheets

(51) Int. Cl.

| | |
|---|---|
| ***H01B 1/22*** | (2006.01) |
| ***C03C 8/16*** | (2006.01) |
| ***C03C 8/18*** | (2006.01) |
| ***C03C 17/04*** | (2006.01) |
| ***C03C 17/34*** | (2006.01) |
| *H01B 1/16* | (2006.01) |
| *H01L 31/18* | (2006.01) |
| *C03C 8/14* | (2006.01) |
| *C03C 8/02* | (2006.01) |
| *C03C 8/22* | (2006.01) |

(52) U.S. Cl.
CPC .......... *C03C 17/04* (2013.01); *C03C 17/3411* (2013.01); *C09D 5/24* (2013.01); *H01B 1/22* (2013.01); *C03C 8/02* (2013.01); *C03C 8/14* (2013.01); *C03C 8/22* (2013.01); *H01B 1/16* (2013.01); *H01L 31/0224* (2013.01); *H01L 31/18* (2013.01); *Y02E 10/50* (2013.01)

(58) Field of Classification Search
CPC .. C03C 17/04; H01B 1/22; C09D 5/24; Y02E 10/50
See application file for complete search history.

(56) References Cited

U.S. PATENT DOCUMENTS 4,753,865 A 6/1988 Fryd et al.
4,968,738 A 11/1990 Dershem
5,188,990 A 2/1993 Dumesnil et al.
5,770,631 A * 6/1998 Fukutomi ............ B01D 69/141 428/500
6,001,549 A * 12/1999 Nair ......................... G03C 1/89 430/527
6,399,675 B1 * 6/2002 Kim ..................... C08G 61/123 252/500
6,545,095 B1 * 4/2003 Solomon ................ A61K 8/042 525/192
7,494,607 B2 2/2009 Wang et al.
7,842,732 B2 11/2010 Ziser et al.
7,939,594 B2 5/2011 Obrecht et al.
8,119,581 B2 2/2012 Fessenbecker et al.
8,367,051 B2 2/2013 Matyjaszewski et al.
8,394,396 B2 3/2013 Brick et al.
8,497,420 B2 7/2013 Carroll et al.
8,629,205 B2 1/2014 Fessenbecker et al.
8,808,581 B2 8/2014 Vernooy et al.
8,888,264 B2 11/2014 Spinelli et al.
8,889,979 B2 11/2014 Carroll et al.
8,895,843 B2 11/2014 Carroll et al.
8,968,607 B2 3/2015 Choi et al.
2003/0036020 A1 2/2003 Kubota
2004/0147653 A1 * 7/2004 Konno ................. H01G 4/2325 524/401
2004/0155227 A1 8/2004 Bechtloff et al.
2005/0182158 A1 8/2005 Ziser et al.
2005/0272861 A1 * 12/2005 Qiao ......................... C08F 2/06 524/591
2007/0135573 A1 6/2007 Ziser et al.
2007/0256857 A1 * 11/2007 Kamikoriyama .... C08K 5/0091 174/257
2008/0030654 A1 * 2/2008 Slutsky ................... H01J 9/022 349/70
2009/0326137 A1 12/2009 Hsu et al.
2012/0128898 A1 * 5/2012 Inoue ..................... B82Y 30/00 428/1.1
2013/0011959 A1 1/2013 Konno
2013/0061919 A1 * 3/2013 Carroll ............ H01L 31/022425 136/256
2013/0098431 A1 4/2013 Chen et al.
2013/0099177 A1 * 4/2013 Rajendran ....... H01L 31/022425 252/514
2013/0180583 A1 7/2013 Borland et al.
2014/0084223 A1 * 3/2014 Guo ......................... H01B 1/22 252/514
2014/0124713 A1 5/2014 Majumdar et al.
2014/0296437 A1 * 10/2014 Hatae ...................... C08F 20/00 525/65
2016/0190360 A1 6/2016 Jung et al.
2016/0225925 A1 8/2016 Wolfe et al.

FOREIGN PATENT DOCUMENTS

CN 101645318 A 2/2010
CN 103915132 A 7/2014
CN 103996430 A 8/2014
CN 107919179 A 4/2018
DE 2746481 C2 1/1989
EP 463826 A1 1/1992
EP 1168079 A1 1/2002
EP 2927277 A1 10/2015
JP 2005085724 A * 3/2005
JP 2008063457 A 3/2008
JP 2010-087251 A 4/2010
JP 2010118158 A 5/2010
JP 2010126560 A 6/2010
JP 2012-140558 A 7/2012
JP 2012140558 A 7/2012
JP 2012204325 A 10/2012
JP 5957546 B2 7/2016
JP 6084270 B1 2/2017
JP 2017-092253 A 5/2017
JP 2017-152520 A 8/2017
JP 6236156 B2 11/2017
KR 20100056730 A 5/2010
WO 2010/123967 A2 10/2010
WO 2011/055995 A2 5/2011
WO 2012/106586 A2 8/2012
WO 2012/106589 A2 8/2012
WO 2013/036510 A1 3/2013
WO 2014-032808 A1 3/2014
WO 2014/059577 A1 4/2014
WO 2014/084273 A1 6/2014
WO 2016/111299 A1 7/2016
WO 2016/194882 A1 12/2016

OTHER PUBLICATIONS

Ho et al., "Synthesis and characterization of star-like microgels by one-pot free radical polymerization", Polymer, vol. 46, 2005, pp. 6727-6735.
Lang et al., "Structure of PMMA/EGDMA Star-Branched Microgels", Macromolecules, vol. 24, 1994, pp. 1306-1314.
Wolfe, M. S. et al., "Rheology of Swellable Microgel Dispersions: Influence of Crosslink Density", Journal of Colloid and Interface Science, vol. 133, No. 1, Nov. 1989, pp. 265-277.
Wang, J., "Glass viscosity and structural relaxation by parallel plate rheometry using a thermo-mechanical analyser", Materials Letters, vol. 31, 1997, pp. 99-103.
Dow Cellulosics, "Ethocel Ethylcellulose Polymers Technical Handbook", Dow Chemical Company, Sep. 2005.
ASTM Standard Test Method E-1356-08.
ASTM Standard Test Method C1351M-96.
ASTM C338-93.

* cited by examiner

CONDUCTIVE PASTE COMPOSITION AND SEMICONDUCTOR DEVICES MADE THEREWITH

This application claims priority under 35 U.S.C § 120 to U.S. Ser. No. 62/112,030, filed Feb. 4, 2015 and U.S. Ser. No. 62/175,060, filed Jun. 12, 2015, the contents of which are incorporated by reference in their entirety.

FIELD OF THE INVENTION

The present invention relates to a conductive paste composition that is useful in the construction of a variety of electrical and electronic devices, and more particularly to a paste composition useful in creating conductive structures, including front-side electrodes for photovoltaic devices, and processes for their construction.

TECHNICAL BACKGROUND OF THE INVENTION

An electrical device such as a solar cell is required to have electrodes by which it can be connected to an electrical load to which it supplies electrical energy. Some architectures commonly used for solar cells have one of the electrodes disposed on the light-receiving surface of the cell, so that the electrode ideally is as small as possible to avoid the loss of efficiency that results from shadowing of the incident light. However, the electrode ideally has high electrical conductivity as well, to minimize the loss of efficiency from ohmic heating within the cell. Ordinarily, these requirements necessitate a structure that includes plural fine conductive lines.

US2013011959 discloses a method of manufacturing a solar cell electrode comprising steps of: applying onto a semiconductor substrate a conductive paste comprising (i) a conductive powder, (ii) a glass frit, (iii) ethyl cellulose as an organic polymer and (iv) a solvent comprising 30 to 85 weight percent (wt %) of 1-phenoxy-2-propanol based on the weight of the solvent; and firing the conductive paste.

SUMMARY OF THE INVENTION

An aspect of the disclosure provides a paste composition comprising:

(a) a source of electrically conductive metal;

(b) a glass frit; and (c) an organic vehicle in which the source of electrically conductive metal and the glass frit are dispersed, the organic vehicle comprising microgel particles and a solvent.

In various embodiments, the microgel particles may be of a single type or multiple types.

Another aspect provides a process for forming an electrically conductive structure on a substrate, the process comprising:

(a) providing a substrate having a first major surface;

(b) applying a paste composition onto a preselected portion of the first major surface, wherein the paste composition comprises;

i) a source of electrically conductive metal, ii) a glass frit, and iii) an organic vehicle in which the source of electrically conductive metal and the glass frit are dispersed, the organic vehicle comprising microgel particles and a solvent, and (c) firing the substrate and paste composition thereon, whereby the electrically conductive structure is formed on the substrate.

Still another aspect provides an article comprising a substrate and an electrically conductive structure thereon, the article having been formed by the foregoing process. For example, the substrate may be a silicon wafer and the article may comprise a semiconductor device or a photovoltaic cell.

Yet another aspect provides a semiconductor substrate having opposed first and second major surfaces and comprising:

a. an antireflective coating on the first major surface;

b. a paste composition deposited onto a preselected portion of the first major surface and configured to be formed by a firing operation into a conductive structure in electrical contact with the semiconductor substrate, wherein the paste composition comprises:

i) a source of electrically conductive metal, ii) a glass frit, and iii) an organic vehicle in which the source of electrically conductive metal and the glass frit are dispersed, the organic vehicle comprising microgel particles and a solvent.

BRIEF DESCRIPTION OF THE DRAWINGS

The invention will be more fully understood and further advantages will become apparent when reference is made to the following detailed description of the preferred embodiments and the accompanying drawings, wherein like reference numerals denote similar elements throughout the several views and in which.

DETAILED DESCRIPTION (Method of Manufacturing an Electrical Device)

An aspect of the disclosure provides a process for manufacturing an electrical device comprising: preparing a substrate, applying a conductive paste in a preselected pattern onto the substrate, and heating the applied conductive paste to form an electrode.

One possible embodiment of a process for manufacturing a p-base-type solar cell as an electrical device is discussed below. However, this and other manufacturing processes herein are not limited to fabrication of solar cells of the type described. For example, a skilled person will recognize that these manufacturing processes are applicable to the fabrication of n-type solar cells, solar cells of other architectures, and other electrical devices such as printed circuit boards, optical devices and display panels.

Figure 1A:
FIG. 1A to 1F are drawings in cross-section view for explaining a solar cell electrode manufacturing process.
Figure 1B:
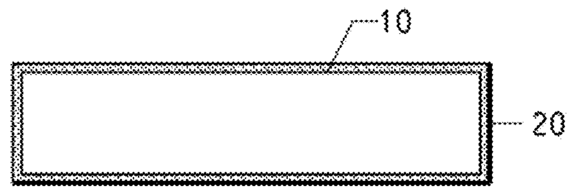

FIG. 1A shows a p-type silicon substrate 10. In FIG. 1B, an n-layer 20, of the reverse conductivity type is formed by the thermal diffusion of phosphorus (P) or the like. Phosphorus oxychloride ($POCl_3$) is commonly used as the phosphorus diffusion source. In one possible implementation, n-layer 20 is formed over the entire surface of the silicon substrate 10. The silicon wafer consists of p-type substrate 10 and n-layer 20 typically has a sheet resistivity on the order of several tens of ohms per square (ohm/□).

Any type of substrate can be selected for the practice of the present disclosure. Other useful substrates include, without limitation, ceramic substrates, glass substrates, polymer film substrates, or other semiconductor substrates.

Figure 1C:
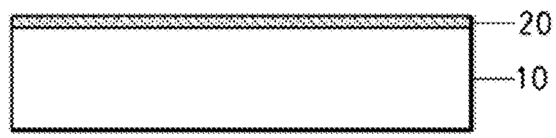

After protecting one surface of the n-layer with a resist or the like, the n-layer 20 is removed from most surfaces by etching so that it remains only on a first major surface as shown in FIG. 1C. The resist is then removed using a solvent or the like.

Figure 1D:
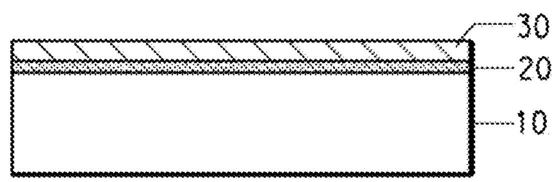

Next, FIG. 1D shows the formation of a passivation layer 30 on the n-layer 20 by a process such as plasma chemical vapor deposition (CVD). $SiN_x$, $TiO_2$, $Al_2O_3$, $SiO_x$ or ITO could be used as a material for a passivation layer. Most commonly used is $Si_3N_4$. The passivation layer is sometimes termed an anti-reflection layer, especially when it is formed on the front side that is appointed as the light receiving side of the semiconductor substrate for a solar cell.

Figure 1E:
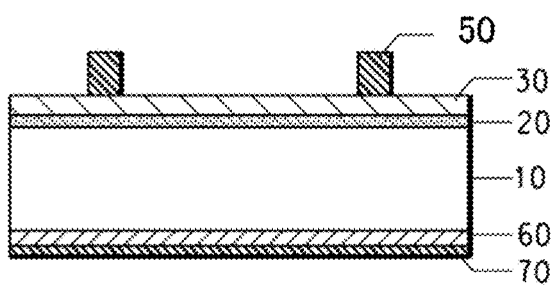

As shown in FIG. 1E, conductive paste composition 50 for a front electrode is applied on the passivation layer 30 on the silicon substrate and then dried. In an embodiment the front electrode is applied by screen printing the conductive paste through a screen mask that defines a preselected pattern for the deposition. An aluminum paste, 60, and a silver paste, 70, are screen printed onto the back side of the substrate, 10.

After deposition, the pastes are optionally dried by heating, which in an embodiment may be to a temperature of 60 to 300° C. Then the electrode is formed by heating the printed conductive paste, in an operation often called firing. In various embodiments, the firing is carried out at a temperature that may be in the range between about 300° C. and about 1000° C., or about 300° C. and about 525° C., or about 300° C. and about 650° C., or about 650° C. and about 1000° C. The firing may be conducted using any suitable heat source, and may be performed in an atmosphere composed of air, nitrogen, an inert gas, or an oxygen-containing mixture such as a mixed gas of oxygen and nitrogen. In an embodiment, the firing is accomplished by passing the substrate bearing the printed paste composition pattern through a belt furnace at high transport rates, for example between about 100 to about 500 cm per minute, with resulting hold-up times between about 0.05 to about 5 minutes. For example, the heating profile can provide 10 to 60 seconds at over 400° C. and 2 to 10 seconds at over 600° C. With such a heating condition, damage to the semiconductor substrate can be minimized. Multiple temperature zones may be used to control the desired thermal profile in the furnace, and the number of zones may vary, for example, between 3 to 11 zones. The temperature of a firing operation conducted using a belt furnace is conventionally specified by the furnace set point in the hottest zone of the furnace, but it is known that the peak temperature attained by the transiting substrate in such a process is somewhat lower than the highest set point. Other batch and continuous rapid fire furnace designs known to one of skill in the art are also contemplated.

The conductive structure thus formed can have any desired configuration. One configuration frequently employed for planar front-side electrodes of solar cells includes one or more relatively wide bus bars and a plurality of finger-like line segments or projections that may extend perpendicularly from the one or more bus bars in a comb-like arrangement. The present paste composition can be printed in a configuration that includes the fine lines in a comb-like electrode structure. As used herein, the term “fine line” refers to a trace of conductive material on a substrate that has a length greatly exceeding its width or its height. In certain implementations, fine lines formed using the present paste composition have a width ranging from a lower line width that is one of 10 μm, 15 μm, 20 μm, 25 μm, or 30 μm to an upper line width that is one of 35 μm, 40 μm, 45 μm, or 50 μm.

Ideally, the fine-line conductors for a front-side solar cell electrode have high aspect ratio, by which is meant a ratio of the conductor height to width, so that a relatively narrow conductor can still have a high cross-sectional area in a plane perpendicular to the conduction direction. A high cross-sectional area in turn minimizes the resistance per unit length of the conductor. In an embodiment, the present conductive structure comprises one or more lines having a minimum aspect ratio of 0.20, 0.25, or 0.30, and a maximum aspect ratio that is as high as possible, consistent with stability of the finished electrode. Aspect ratio can be measured by any suitable technique capable of determining line width and height. For example, lines can be imaged to determine height by a confocal laser scanning microscope, such as a Model OPTELICS C130 from Lasertec Corporation. Widths can be determined by an optical microscope, such as a micro image checker Model A200 (Panasonic). Typically, the height and width are obtained by averaging measurements taken at a plurality of representative points to improve accuracy. In a related embodiment, the conductive structure comprises one or more fine lines that having a combination of any of the foregoing widths and aspect ratios.

Figure 1F:
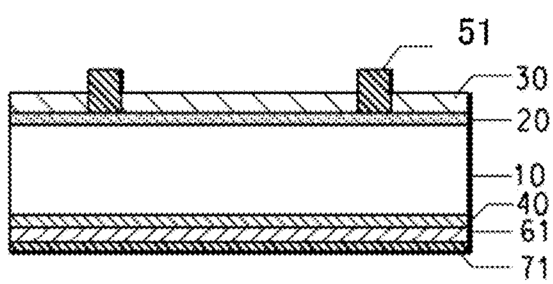

FIG. 1F depicts the results of the firing operation, wherein the conductive structure including front electrode 51 is formed from the conductive paste 50. After fire-through, electrode 51 establishes electrical contact with n-type layer 20. The firing operation is also believed in some embodiments to effect a substantially complete burnout of the organic vehicle from the deposited paste by volatilization and/or pyrolysis of the organic materials.

As also shown in FIG. 1F, aluminum may diffuse as an impurity from the aluminum paste into the silicon substrate, 10, on the back side during firing, thereby forming a $p^+$ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. In most embodiments, the back surface is substantially fully covered by the aluminum electrode, at least in part to promote formation of a $p^+$ layer, 40. At the same time, because soldering to an aluminum electrode is not easy, the silver paste, 70, is used to form a backside electrode, 71, on selected areas of the backside as an electrode for interconnecting solar cell cells and load circuitry by means of copper ribbon or the like in an embodiment.

Although a p-base type of solar cell is shown as an example, the present is applicable for constructing an n-base type of solar cell or any other type of solar cell or other electrical or electronic device wherein a conductive structure is formed using a conductive paste, e.g. by heating or firing.

Conductive Paste

In an aspect, this disclosure provides a paste composition that comprises: a functional conductive component, such as a source of electrically conductive metal; a glass frit or like oxide material; an optional discrete frit additive; and an organic vehicle that includes a microgel. Certain embodiments involve a photovoltaic cell that includes a conductive structure made with the present paste composition. Such cells may provide any combination of one or more of high photovoltaic conversion efficiency, high fill factor, and low series resistance.

I. Inorganic Components

A. Electrically Conductive Metal

The present paste composition includes a source of an electrically conductive metal. Exemplary metals include without limitation silver, gold, copper, nickel, palladium, platinum, aluminum, and alloys and mixtures thereof. Silver beneficially affords good processability and high conductivity. In an ideal solar cell, high conductivity electrodes are required to permit electrical energy generated in the cell to be efficiently supplied to an external circuit load. However, a composition including at least some non-precious metal may be used to reduce cost.

The conductive metal may be incorporated directly in the present paste composition as a metal powder. In another embodiment, a mixture of two or more such metals is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$ or AgO) or silver salts such as AgCl, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used.

Electrically conductive metal powder used in the present paste composition may be supplied as finely divided particles having any one or more of the following morphologies: a powder form, a flake form, a spherical form, a rod form, a granular form, a nodular form, a crystalline form, other irregular forms, or mixtures thereof. The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. As used herein, "particle size" is intended to refer to "median particle size" or $d_{50}$, by which is meant the 50% volume distribution size. The distribution may also be characterized by other distribution parameters, such as $d_{90}$, meaning that 90% by volume of the particles are smaller than $d_{90}$. Volume distribution size may be determined by a number of methods understood by one of skill in the art, including but not limited to laser diffraction and dispersion methods employed by a Microtrac particle size analyzer (Montgomeryville, Pa.). Laser light scattering, e.g., using a model LA-910 particle size analyzer available commercially from Horiba Instruments Inc. (Irvine, Calif.), may also be used. In various embodiments, the median particle size ranges between 0.01 μm and 10 μm, or 0.3 μm and 5 μm, or 0.8 μm and 3 μm. With such particle diameter, the conductive powder can be sintered well. For example, large particles can be sintered more slowly than small particles. Furthermore, it can be also necessary that the particle diameter can be appropriate for a method used to apply the conductive paste onto a semiconductor substrate, for example, screen printing. In an embodiment, it is possible to mix two or more types of conductive powder of different diameters and/or morphologies.

In an embodiment, the conductive powder is of ordinary high purity (99%). However, depending on the electrical requirements of the electrode pattern, less pure conductive powders can also be used.

The electrically conductive metal may comprise any of a variety of percentages of the composition of the paste composition. To attain high conductivity in a finished conductive structure, it is generally preferable to have the concentration of the electrically conductive metal be as high as possible while maintaining other required characteristics of the paste composition that relate to either processing or final use. In an embodiment, the conductive powder comprises 50 weight percent (wt %) or more of the total weight of the conductive paste. In other embodiments, the conductive powder comprises 60, 70, 75, 80, 85, or 90 wt % or more of the conductive paste. In other embodiments, the silver or other electrically conductive metal may comprise about 75% to about 99% by weight, or about 85% to about 99% by weight, or about 95% to about 99% by weight, of the inorganic solids component of the paste composition. In another embodiment, the solids portion of the paste composition may include about 80 wt. % to about 90 wt. % silver particles and about 1 wt. % to about 9 wt. % silver flakes. In an embodiment, the solids portion of the paste composition may include about 70 wt. % to about 90 wt. % silver particles and about 1 wt. % to about 9 wt. % silver flakes. In another embodiment, the solids portion of the paste composition may include about 70 wt. % to about 90 wt. % silver flakes and about 1 wt. % to about 9 wt. % of colloidal silver. In a further embodiment, the solids portion of the paste composition may include about 60 wt. % to about 90 wt. % of silver particles or silver flakes and about 0.1 wt. % to about 20 wt. % of colloidal silver.

The electrically conductive metal used herein, particularly when in powder form, may be coated or uncoated; for example, it may be at least partially coated with a surfactant to facilitate processing. Suitable coating surfactants include, for example, stearic acid, palmitic acid, a salt of stearate, a salt of palmitate, and mixtures thereof. Other surfactants that also may be utilized include lauric acid, oleic acid, capric acid, myristic acid, linoleic acid, and mixtures thereof. Still other surfactants that also may be utilized include polyethylene oxide, polyethylene glycol, benzotriazole, poly(ethylene glycol)acetic acid, and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound.

In an embodiment, one or more surfactants may be included in the organic vehicle in addition to any surfactant included as a coating of conductive metal powder used in the present paste composition.

As further described below, the electrically conductive metal can be dispersed in an organic vehicle that acts as a carrier for the metal phase and other constituents present in the formulation.

B. Glass Frit

The present paste composition includes a fusible oxide material. The term "fusible," as used herein, refers to the ability of a material to become fluid upon heating, such as the heating employed in a firing operation. In some embodiments, the fusible material is composed of one or more fusible subcomponents. For example, the fusible material may comprise a glass material, or a mixture of two or more glass materials. Glass material in the form of a fine powder, e.g., as the result of a comminution operation, is often termed "frit" and is beneficially employed as the oxide material of some embodiments of the present paste composition.

While the present invention is not limited by any particular theory of operation, it is believed that in some embodiments, the glass frit (or other like oxide material) and the frit additive (if present) act in concert during firing to efficiently penetrate the insulating layer normally present on the wafer, such as a naturally occurring or intentionally formed passivation layer and/or an antireflective coating. Such a result is frequently termed "firing through." The glass frit and frit additive are also thought to promote sintering of the conductive metal powder, e.g. silver, that forms the electrode in some embodiments.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes give rise to the narrow peaks, whose position in reciprocal space is in accordance with Bragg's law. A glass material also does not show a substantial crystallization exotherm upon heating close to or above its glass transition temperature or softening point, $T_g$, which is defined as the second transition point seen in a differential thermal analysis (DTA) scan. In an embodiment, the softening point of glass material used in the present paste composition is in the range of 300 to 800° C. In other embodiments, the softening point is in the range of 250 to 650° C., or 300 to 500° C., or 300 to 400° C., or 390 to 600° C., or 400 to 550° C., or 410 to 460° C. Glass frits having such softening points can melt properly to obtain effects such as those mentioned above. Alternatively, the "softening point" can be obtained by the fiber elongation method of ASTM C338-93.

It is also contemplated that some or all of the fusible oxide material may be composed of material that exhibits some degree of crystallinity. For example, in some embodiments, a plurality of oxides are melted together, resulting in a material that is partially amorphous and partially crystalline. As would be recognized by a skilled person, such a material would produce an X-ray diffraction pattern having narrow, crystalline peaks superimposed on a pattern with broad, diffuse peaks. Alternatively, one or more constituents, or even substantially all of the fusible material, may be predominantly or even substantially fully crystalline. In certain embodiments, crystalline material useful in the fusible material of the present paste composition may have a melting point of at most 700° C., 750° C., or 800° C.

The inorganic powder optionally further comprises a glass frit. Especially when forming an electrode by firing a conductive paste, a glass frit melts to promote sintering the conductive powder, and adhere the electrode to the substrate.

Particle diameter of the glass frit can be 0.1 to 7 μm in an embodiment, 0.3 to 5 μm in another embodiment, 0.4 to 3 μm in another embodiment, 0.5 to 1 μm in another embodiment. With such particle diameter, the glass frit can be uniformly dispersed in the paste. The particle diameter ($d_{50}$) can be obtained in the same manner as described above for the conductive powder.

The chemical composition of the glass frit here is not limited. Any glass frit suitable for use in electrically conducting pastes for electronic materials is acceptable. For example, and without limitation, lead borosilicate, lead silicate, and lead tellurium glass frits can be used. For example, lead tellurium oxide-containing glass frits useful in the present paste composition include without limitation ones provided by U.S. Pat. Nos. 8,497,420, 8,895,843, and 8,889,979, which are all incorporated herein for all purposes by reference thereto. In addition, zinc borosilicate or lead-free glasses can be also used.

Although in some embodiments the present composition (including the glass frit or like material contained therein) may contain a substantial amount of lead, lead oxide, or other lead compound, other embodiments are lead-free. As used herein, the term "lead-free paste composition" refers to a paste composition to which no lead has been specifically added (either as elemental lead or as a lead-containing alloy, compound, or other like substance), and in which the amount of lead present as a trace component or impurity is 1000 parts per million (ppm) or less. In some embodiments, the amount of lead present as a trace component or impurity is less than 500 ppm, or less than 300 ppm, or less than 100 ppm.

Similarly, embodiments of the present paste composition may comprise cadmium, e.g., in an amount up to 5 cation %, while others are cadmium-free, again meaning that no Cd metal or compound is specifically added and that the amount present as a trace impurity is less than 1000 ppm, 500 ppm, 300 ppm, or 100 ppm.

The amount of the glass frit can be determined based on the amount of the conductive powder and/or other paste constituents. The weight ratio of the conductive powder and the glass frit (conductive powder:glass frit) can be 10:1 to 100:1 in an embodiment, 25:1 to 80:1 in another embodiment, 30:1 to 68:1 in another embodiment, 42:1 to 53:1 in another embodiment. With such amount of the glass frit, sintering a conductive powder and adhesion between an electrode and a substrate can be properly effected.

In various embodiments, the glass frit can be 0.25 to 8 wt %, 0.5 to 6 wt %, 0.5 to 4 wt %, or 1.0 to 3 wt % based on the total weight of the conductive paste.

The embodiments of the glass frit or like material described herein are not limiting. It is contemplated that one of ordinary skill in the art of glass chemistry could make minor substitutions of additional ingredients and not substantially change the desired properties of the given composition, including its interaction with a substrate and any insulating layer thereon.

C. Optional Oxide Additive

The inorganic oxide material in the present paste composition may optionally comprise a plurality of separate fusible substances, such as one or more frits, or frit with another crystalline frit additive material. In a non-limiting embodiment, lithium ruthenate ($LiRuO_3$) has been found to be a suitable frit additive. In various embodiments, the frit additive may comprise 0.01-2%, 0.05-1.5%, or 0.1-1%, based on the total weight of the conductive paste.

II. Organic Vehicle

The inorganic components of the present composition are typically dispersed in an organic vehicle to form a relatively viscous material referred to as a "paste" or an "ink" that has a consistency and rheology that render it suitable for printing processes, including without limitation screen printing. The mixing is typically done with a mechanical system, and the constituents may be combined in any order, as long as they are uniformly dispersed and the final formulation has characteristics such that it can be successfully applied during end use.

A wide variety of inert materials can be admixed in an organic medium in the present composition including, without limitation, an inert, non-aqueous liquid that may or may not contain thickeners, binders, or stabilizers. By "inert" is meant a material that may be removed by a firing operation without leaving any substantial residue and that has no other effects detrimental to the paste or the final conductor line properties.

The proportions of organic vehicle and inorganic components in the present paste composition can vary in accordance with the method of applying the paste and the kind of organic vehicle used. In an embodiment, the present paste composition typically contains about 50 to 95 wt. %, 76 to 95 wt. %, or 85 to 95 wt. %, of the inorganic components and about 5 to 50 wt. %, 5 to 24 wt. %, or 5 to 15 wt. %, of the organic vehicle.

The organic vehicle typically provides a medium in which the inorganic components are dispersible with a good degree of stability. In particular, the composition preferably has a stability compatible not only with the requisite manufacturing, shipping, and storage, but also with conditions encountered during deposition, e.g., by a screen printing process. Ideally, the rheological properties of the vehicle are such that it lends good application properties to the composition, including stable and uniform dispersion of solids, appropriate viscosity and thixotropy for printing, appropriate wettability of the paste solids and the substrate on which printing will occur, a rapid drying rate after deposition, and stable firing properties.

A. Microgel

The present conductive paste composition includes particles of one or more microgels. As used herein, the expression "particles of a microgel" refers to particles of a cross-linked polymer that have a median or average particle size of 20 nm to 2 μm in their unswollen condition. In various embodiments, the microgel particles may have a median particle size ranging from a lower limit of 20, 50, 75, or 100 nm to an upper limit of 0.8, 1, 1.5, or 2 μm. An ensemble of such microgel particles may be termed a "microgel polymer."

Particles of a microgel composition can be prepared by any process that can polymerize a suitable monomer or combination of monomers. Microgels in some embodiments are produced by an emulsion polymerization process, in which one or more suitable monomers, an effective amount of a cross linker, and a suitable organic solvent are introduced into aqueous solution.

Suitable monomers include, without limitation, vinyl-containing monomers, such as acrylates and methacrylates, or a combination of any such monomers. As used herein, the nomenclature "(meth)acrylate" refers collectively to both acrylates and methacrylates. Similarly, the adjective "(meth) acrylic" is understood to mean either "acrylic" or "methacrylic."

Among the (meth)acrylates usefully prepared as microgel particles that are to be incorporated in the present paste composition, and without limitation, are ethyl acrylate (EA), methyl acrylate (MA), methyl methacrylate (MMA), n-butyl methacrylate (BMA), iso-butyl methacrylate (iBMA), benzyl methacrylate (BzMA), styrene, and 2-(2-Oxo-1-imidazolidinyl)ethyl methacrylate (UMA), and mixtures thereof in any proportion. In various embodiments, the present microgel particles may be produced using a mixture of BMA and MMA in any proportion or a mixture of BMA, MMA, and UMA in any proportion.

Any operable cross linking agent providing at least difunctionality may be used. A suitable difunctional cross linker is ethylene glycol dimethacrylate (EGDMA). Other useful crosslinkers include, without limitation, 1,4-butanediol dimethacrylate, poly(ethylene glycol) dimethacrylate, glycerol dimethacrylate, glycerol trimethacrylate, diethyleneglycol dimethacrylate, triethyleneglycol dimethacrylate, trimethylolpropane trimethacrylate, or any mixture thereof. In various embodiments, the crosslinker is present in an amount ranging from a lower limit of 0.1, 0.25, or 0.5% to an upper limit of 1, 2, 4, 6, or 8% based on the weight of the total monomer. It is typically found that a lower crosslinker content results in higher swelling of the microgel particles when they are introduced into a solvent and a higher viscosity at a given concentration.

Acrylate and methacrylate species having trifunctionality or higher may also be used to provide the required cross-linking. Possible triacrylate crosslinkers include, but are not limited to: trimethylol propane triacrylate, isocyanurate triacrylate, glycerol triacrylate, ethoxylated trimethylolpropane triacrylate, propoxylated trimethylolpropane triacrylate, tris (2-hydrox-yethyl)isocyanurate triacrylate, ethoxylated glycerol triacrylate, propoxylated glycerol triacrylate, pentaerythritol triacrylate, aryl urethane triacrylates, aliphatic urethane triacrylates, melamine triacrylates, epoxy novolac triacrylates, aliphatic epoxy triacrylate, polyester triacrylate, and mixtures thereof, and any of their methacrylate analogs.

Possible tetraacrylate crosslinkers include, but are not limited to: pentaerythritol tetraacrylate, ethoxylated pentaerythritol tetraacrylate, propoxylated pentaerythritol tetraacrylate, dipentaerythritol tetraacrylate, ethoxylated dipentaerythritol tetraacrylate, propoxylated dipentaerythritol tetraacrylate, aryl urethane tetraacrylates, aliphatic urethane tetraacrylates, melamine tetraacrylates, epoxy novolac tetraacrylates, polyester tetraacrylates and mixtures thereof, and any of their methacrylate analogs.

Some embodiments of the present paste composition comprise microgel particles of a single composition. Other embodiments include microgels of two or more compositions. For example, two microgels may be included that are formed from the same monomer (or mixture of monomers) but have a different type and/or amount of crosslinker. Alternatively, the respective microgels may be formed from different monomers and may have the same or different types and/or amounts of crosslinker. In a further alternative, microgels having different median particle size may be employed.

The solution optionally includes one or more of an organic solvent, an initiator, or a surfactant. Then the particles can be removed from the dispersion by heat and/or vacuum. Typically the resulting particles range in median size from 20 nm to 2 μm, as measured in the aqueous dispersion. In an embodiment, the particles (before any swelling from solvent incorporation) range in median size from a lower microgel size limit that is one of 20 nm, 50 nm, 70 nm, or 100 nm, to an upper microgel size limit that is one of 300 nm, 500 nm, 1 μm, 1.5 μm, or 2 μm. Particle size measurement can be done with a laser light scattering technique, e.g. using a Microtrac particle size analyzer (Montgomeryville, Pa.).

Other polymerization techniques suitable for producing microgel particles may also be used including, without limitation, solution polymerization, dispersion polymerization, mini-emulsion polymerization, precipitation polymerization. If necessary, particles produced by these techniques may be comminuted, e.g. by mechanical grinding, ball milling, jet milling, or the like, to produce a powder that is readily dispersed into a suitable liquid dispersant.

In an embodiment, the microgel particles include polymers having molecular weights ranging from $10^7$ to $10^{12}$, or from $10^7$ to $10^{10}$, or from $10^8$ to $10^9$. Useful microgel particles include, without limitation, ones that are swellable upon exposure to a solvent.

In addition to a microgel, the present paste composition may include one or more other polymeric materials including, without limitation: Ethocel® Std 4 ethylcellulose-based polymer (Dow Chemical Company, Midland, Mich.), said by its manufacturer to have an ethoxyl content of 58.0 to 49.5% and to act as a rheology modifier and binder; Vamac® G diamine-cured terpolymer of ethylene, methylacrylate, and a cure site monomer elastomer (E. I. DuPont de Nemours and Company, Wilmington Del.); and Foralyn™ 110 pentaerythritol ester of hydrogenated rosin (Eastman Chemical, Kingsport, Tenn.).

In possible embodiments, the organic polymer (exclusive of solvent) can be 0.01 to 5.0 parts by weight, 0.02 to 3.0 parts by weight, or 0.03 to 2.0 parts by weight when the inorganic powder is 100 parts by weight. The conductive paste can have an appropriate viscosity with such amount of the organic polymer to facilitate deposition by screen printing or the like.

The organic polymer can be 0.01 to 5 wt %, in another embodiment 0.03 to 2.5 wt %, in another embodiment 0.05 to 1 wt % based on the total weight of the conductive paste.

C. Solvent

One or more solvents is incorporated in the present organic vehicle. Beneficial effects of the solvent(s) include any one or more of: swelling and/or dispersing the microgel particles; dissolving any organic resins contained in the paste; and stabilizing a concentrated suspension of the inorganic solids present. Ideally the solvent and other organics can be completely removed during a firing operation.

In an embodiment, the solvent can comprise ester alcohols such as Texanol™ solvent (TEX, 2,2,4-trimethyl-1,3-pentadiol monoisobutyrate) (Eastman Chemical Co., Kingsport, Tenn.); butyl carbitol acetate (BCA, diethylene glycol n-butyl ether acetate, Dow Chemical Company, Midland, Mich.); dibenzyl ether; benzyl alcohol or other higher alcohols; acetates; benzyl benzoate; 2-pyrrolidone; dibasic ester (DBE); terpineol; or any mixture thereof. DBE can be obtained from INVISTA Inc., Wilmington, Del., in various formulations denoted as DBE-2, DBE-3, DBE-4, DBE-5, DBE-6, DBE-9 or DBE-IB. Other solvents that promote one or more beneficial paste properties are also contemplated.

The solvent can be 1 to 100 parts by weight in an embodiment, 2 to 50 parts by weight in another embodiment, 3 to 30 parts by weight in another embodiment, 5 to 20 parts by weight in another embodiment when the inorganic powder comprises 100 parts by weight.

The solvent can be 3.0 to 40.0 wt % in an embodiment, 4.0 to 30.0 wt % in another embodiment, 5.0 to 20.0 wt % in another embodiment, 5.0 to 10.0 wt % in another embodiment, based on the weight of the conductive paste. With such amount of solvent, a conductive paste could obtain sufficient viscosity for printability.

D. Other Organics

The organic vehicle may further comprise other organic substances including, without limitation, surfactants, dispersants, thickeners, thixotropes, other rheology- or viscosity-adjusting agents, and binders.

Surfactants found useful in the present paste composition include, without limitation: Duomeen® TDO surfactant (Akzo Nobel Surface Chemistry, LLC, Chicago, Ill.); Tween® 20 surfactant (Aldrich), a polyoxyethylene sorbitol ester represented by the manufacturer as having a calculated molecular weight of 1,225 daltons, assuming 20 ethylene oxide units, 1 sorbitol, and 1 lauric acid as the primary fatty acid; and sodium dodecyl sulfate (SDS).

A wide variety of thixotropic agents are useful, including gels, organics, and agents derived from natural sources such as castor oil or a derivative thereof. Such substances promote shear thinning behavior in some embodiments. Thixatrol® MAX and Thixatrol® PLUS amides (Elementis Specialties, Inc., Hightstown, N.J.) are exemplary thixotropic rheology modifiers. Other low molecular weight amides or amide-olefin oligomers may also be suitable.

The various components of the organic vehicle interact with the inorganic solids to influence the rheology of the paste composition, and thus its behavior during deposition, e.g. by screen printing.

The conductive paste composition may have any viscosity that is compatible with the desired deposition process. Frequently, the paste composition is adjusted prior to deposition by addition of a small hold-back of a suitable solvent. In some implementations, a final viscosity at 25° C. of about 300±50 Pa·s or more has been found convenient for screen printing fine electrode lines. In other embodiments, the viscosity at 25° C. is 330 to 550 Pa·s, or 350 to 520 Pa·s, or 420 to 500 Pa·s. The viscosity of the conductive paste can be measured with Brookfield HBT viscometer with a utility cup using a #14 spindle, with values being taken after 3 min at 10 rpm or other similar apparatus.

In some embodiments, one or more of the components of the organic vehicle promotes thixotropy, or shear thinning. An indication of the degree of shear thinning can be obtained by carrying out viscosity measurements after different times and at different rotation rates, e.g., by comparing values obtained at 0.5 rpm (3 min), 10 rpm (3 min), and/or 50 rpm (6 min).

EXAMPLES

The operation and effects of certain embodiments of the present invention may be more fully appreciated from a series of examples (Examples 1-51) described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Ingredients Used

Ingredients useful in preparing the present paste composition include the following. Unless otherwise stated, these ingredients are used in preparing the Examples below.

Silver Metal Powders:

Silver powders having approximately spherical shape and drawn from different lots, with $d_{50}$ and organic surfactant coating as indicated:

Ag-A: (coated, $d_{50}$~1.8-2.0 μm).

Ag-B: (uncoated, $d_{50}$~1.2 μm).

Ag-C: (coated, $d_{50}$~1.8-2.0 μm).

Ag-D: (coated, $d_{50}$~1.8-2.0 μm).

Glass frit:

Pb—Te—O containing glass having a $d_{50}$ value of 0.5-0.7 μm

Frit Additive:

lithium ruthenate ($LiRuO_3$) (synthesized in the lab)

(Meth)Acrylate Monomers:

MMA: methyl methacrylate (Aldrich)

BMA: n-butyl methacrylate (Aldrich)

BzMA: benzyl methacrylate (Aldrich)

UMA: 25 wt % 2-(2-Oxo-1-imidazolidinyl)ethyl methacrylate in MMA (Aldrich)

i-BMA: iso-butyl methacrylate (Aldrich)

Other Polymers:

Ethocel® Std 4 ethylcellulose-based polymer (Dow Chemical Company, Midland, Mich.), said by manufacturer to have an ethoxyl content of 58.0 to 49.5% and to act as a rheology modifier and binder.

Vamac® G diamine-cured terpolymer of ethylene, methylacrylate, and a cure site monomer elastomer (E. I. DuPont de Nemours and Company, Wilmington Del.)

Foralyn™110 pentaerythritol ester of hydrogenated rosin (Eastman Chemical, Kingsport, Tenn.)

Crosslinker:

EGDMA: Ethylene glycol dimethacrylate

Solvents:

TEX: Texanol™ ester alcohol solvent (2,2,4-trimethyl-1, 3-pentadiol monoisobutyrate) (Eastman Chemical Co., Kingsport, Tenn.)

BCA: Butyl CARBITOL™ solvent (diethylene glycol n-butyl ether acetate) (Dow Chemical Company, Midland, Mich.)

Dibasic ester-3 (DBE-3) (E. I. DuPont de Nemours and Company, Wilmington, Del.)

benzyl benzoate dibenzyl ether

Other Organics:

Thixatrol® MAX amide thixotrope rheology modifier (Elementis Specialties, Inc., Hightstown, N.J.)

Thixatrol® PLUS amide thixotrope rheology modifier (Elementis Specialties, Inc., Hightstown, N.J.)

Duomeen® TDO surfactant (Akzo Nobel Surface Chemistry, LLC, Chicago, Ill.)

Tween® 20 surfactant: polyoxyethylene sorbitol ester, represented by the manufacturer as having a calculated molecular weight of 1,225 daltons, assuming 20 ethylene oxide units, 1 sorbitol, and 1 lauric acid as the primary fatty acid. (Aldrich)

sodium dodecyl sulfate (SDS) (Aldrich)

Other:

ammonium persulfate (APS) (Aldrich)

Example 1

Synthesis of a BMA/MMA Microgel Emulsion Polymer

A microgel emulsion polymer appointed to be incorporated in a screen-printable conductive paste composition was synthesized as follows.

A 500 mL round bottom flask was fitted with a condenser, addition funnel, and nitrogen gas inlet with bubbler. The flask was placed in a thermostatically-controlled oil bath and equipped with a PTFE/glass mechanical stirring bar. Deionized water (150 g) was added and heated to 85° C. Then 134 mg of sodium dodecyl sulfate (SDS) and 0.44 g of a 7% $KH_2PO_4$ solution (neutralized to pH~7 using KOH) were added. A monomer mixture of 18.5 g n-butyl methacrylate (BMA) and 18.5 g methyl methacrylate (MMA), along with 98 mg of ethylene glycol dimethacrylate (EGDMA) crosslinker (corresponding to 0.264 wt %) was separately prepared in a beaker. (No attempt was made in any of the preparations described herein to remove any inhibitor included by the manufacturer in the as-supplied monomers.) About 10 mL of the monomer mixture was added into the flask, and stirring was commenced at 314 rpm. Then 0.40 g of a 5 wt % solution of ammonium persulfate (APS) initiator in water was added. With continued stirring and a nitrogen head, the remaining monomer mixture was added in portions over a 1 h period. The heating and stirring continued for a total of 5.5 h. It was noted that there was residual monomer and low conversion indicated by only mild opacity. Hence, another aliquot of 0.40 g of 5 wt % APS was added and the temperature was raised to 90° C. for another 1.5 h of stirred mixing. Thereafter, the stirring was stopped, with the resulting emulsion appearing very milky and having low monomer odor. The emulsion was coagulated by freezing in dry ice, then filtered with minimal rinsing, and finally dried in an oven maintained at about 50-60° C. with a partial vacuum and continuous nitrogen gas flow, thereby forming microgel particles.

Example 2

Synthesis of a BMA/MMA/UMA Microgel Emulsion Polymer

Another microgel emulsion polymer appointed to be incorporated in a screen-printable conductive paste composition was synthesized as follows, using the same apparatus employed in Example 1.

Deionized water (225 g) was added and heated to 85° C. Then 208 mg of sodium dodecyl sulfate (SDS) and 0.660 g of a 7% $KH_2PO_4$ solution (neutralized to pH~7 using KOH) were added. A monomer mixture of 23.75 g n-butyl methacrylate (BMA), 16.5 g methyl methacrylate (MMA), and 9.94 g of 25 wt % 2-(2-Oxo-1-imidazolidinyl)ethyl methacrylate (UMA) in MMA, along with 125 mg EGDMA crosslinker (corresponding to 0.249 wt %) was separately prepared in a beaker. About 40 mL of the monomer mixture was added into the flask. Stirring commenced at 300 rpm. Then 0.53 g of a 5 wt % solution of ammonium persulfate (APS) initiator in water was added. With continued stirring and under a nitrogen head, the remaining monomer mixture was added in a continuous drip over a 40 min period. Because the reaction was proceeding slowly, additional aliquots of 0.53 g of 5 wt % APS were added at 2 h and at 3.5 h. With continued stirring, the heating continued for a total of 5.5 h. About 10 mL was reserved, with the remainder dried in aluminum pans in ambient laboratory air and thereafter broken up mechanically, thereby forming microgel particles.

Example 3

Synthesis of a BzMA Microgel Emulsion Polymer

A microgel emulsion polymer appointed to be incorporated in a screen-printable conductive paste composition was synthesized as follows.

A 1 L round bottom flask was fitted with a condenser, addition funnel, and nitrogen gas inlet with bubbler. The flask was placed in a thermostatically-controlled oil bath and equipped with a PTFE/glass mechanical stirring bar. Deionized water (450 g) was added and heated to 85° C. Then 409 mg of sodium dodecyl sulfate (SDS) and 1.32 g of a 7% $KH_2PO_4$ solution (neutralized to pH~7 using KOH) were added. A monomer mixture of 109.0 g of benzyl methacrylate (BzMA) with 278 mg of ethylene glycol dimethacrylate (EGDMA) crosslinker (corresponding to 0.255 wt %) was separately prepared in a beaker. About 30 mL of the monomer mixture was added into the flask. Stirring was commenced at 301 rpm, then 1.20 g of a 5 wt % solution of ammonium persulfate (APS) initiator in water was added. The ingredients were stirred at 310 rpm under a nitrogen head, with the remaining monomer mixture being added in a continuous drip over a 1.5 h period. With continued stirring, the heating continued for a total of 6 h. The emulsion was coagulated by freezing in dry ice, then filtered with minimal rinsing, and finally dried in an oven maintained at about 37° C., under partial vacuum, with a continuous flow of nitrogen, thereby forming microgel particles.

Example 4

Synthesis of a BMA/MMA/UMA Microgel Emulsion Polymer with 4% Crosslinker

A microgel emulsion polymer appointed to be incorporated in a screen-printable conductive paste composition was synthesized as follows.

A 3000 mL round bottom flask was fitted with a condenser, thermocouple, and nitrogen gas inlet with bubbler. The flask was placed in a thermostatically-controlled oil bath and equipped with a PTFE/glass mechanical stirrer. Deionized water (900 g) was added into the flask. Then 1.10 g of sodium dodecyl sulfate (SDS) and 3.51 g of a 7% $KH_2PO_4$ solution (neutralized to pH~7 using KOH) were added. The flask was heated to 85° C. with stirring at 300 rpm. A monomer mixture of 126 g n-butyl methacrylate (BMA), 88 g methyl methacrylate (MMA), and 53 g of 25 wt % 2-(2-Oxo-1-imidazolidinyl)ethyl methacrylate (UMA) in MMA, along with 11 g of ethylene glycol dimethacrylate (EGDMA) crosslinker (corresponding to 3.96 wt %) was prepared in a separate flask. (As before, no attempt was made to remove any inhibitor included by the manufacturer in the as-supplied monomers.) About 80 mL of the monomer mixture was added into the round bottom flask and allowed to equilibrate for 10 minutes. Then 0.48 g of ammonium persulfate (APS) initiator dissolved in 9 g of water was added. With continued stirring and a nitrogen head, a syringe pump was used to deliver the remaining monomer mixture over an 80 min period. The reactants were stirred for an additional 5 h at 85° C., after which the resulting emulsion appeared very milky and had low monomer odor. The emulsion was filtered with milk paper to remove coagulant, then poured into aluminum pans, and air-dried in the fume hood for 2 days. The resulting flaky microgel solids were mechanically pulverized by either a mortar and pestle or ball milling to provide fine powder that could be easily dispersed later during paste formulation.

Example 5

Preparation of Polymer Solutions/Dispersions

To facilitate reliable incorporation and mixing into the paste compositions herein, the various polymers or microgels are typically prepared in a suitable solution or dispersion. A representative process for producing these solutions/dispersions is provided below.

A 500 mL vessel is fitted with an air-driven overhead stirrer, nitrogen purge, and thermocouple. The bottom half of the vessel is placed in a circulating silicone oil bath to control the temperature of the preparation. An appropriate solvent is added to the vessel. The requisite amount of the polymeric resin or microgel (ordinarily in the form of a fine powder) is then added slowly to the vessel with gentle stirring. After addition, the temperature of the oil bath is raised to 80° C. The mixture is allowed to stir for 1 to 6 hr at 80° C. under nitrogen purge, during which time the material either dissolved to yield a polymer solution or became dispersed. The microgels typically swell and are dispersed under these conditions but do not dissolve. A final hour at 90° C. with increased agitation is beneficially employed for the microgel preparations assure that the particles are fully swelled and well dispersed. A skilled person will recognize that the temperatures and times used in this processing may be adjusted somewhat, for example temperatures up to 110-120° C. may be used.

The solutions or dispersions listed in Table I are prepared using processes of the foregoing type, with the amounts as indicated. Preparation P7 is prepared using i-BMA polymer produced in a process with conditions and amounts similar to those employed for BzMA (Example 3). Preparation P8 was formulated as generally described in Example 2, but with 2 wt % EGDMA crosslinker instead of 0.25 wt %. The microgel for Preparation P10 was formulated with an APS initiator level of about 0.06% by weigh of the total monomer, whereas the other microgels were formulated with about 0.18% by weight. Preparations P11-P14 were formulated as generally described in Example 3, but with the amounts of EGDMA listed.

TABLE I

Polymer solutions and swelled microgel suspensions

| Preparation | Polymer/Microgel | Crosslinker Level (%) | Amount (g) | Solvent | Amount (g) |
|---|---|---|---|---|---|
| P1 | Ethocel ® Std 4 | — | 20 | TEX | 180 |
| P2 | Vamac ® G | — | 50 | BCA | 150 |
| P3 | Foralyn ® 110 | — | 100 | TEX | 100 |
| P4 | BMA/MMA/UMA (Ex. 2) | 0.25 | 30 | TEX/BCA 1:1 | 170 |
| P5 | BzMA (Ex. 3) | 0.25 | 20 | dibenzyl ether | 180 |
| P6 | BMA/MMA (Ex. 1) | 0.25 | 20 | benzyl benzoate | 180 |
| P7 | i-BMA | 0.25 | 20 | dibenzyl ether | 180 |
| P8 | BMA/MMA/UMA | 2 | 50 | TEX/BCA 1:1 | 150 |
| P9 | BMA/MMA/UMA | 4 | 60 | TEX/BCA 1:1 | 140 |
| P10 | BMA/MMA/UMA (Ex. 4) | 4 | 66 | TEX/BCA 1:1 | 134 |
| P11 | BzMA | 0.5 | 40 | dibenzyl ether | 270 |
| P12 | BzMA | 1 | 50 | dibenzyl ether | 270 |
| P13 | BzMA | 2 | 60 | dibenzyl ether | 270 |
| P14 | BzMA | 4 | 90 | dibenzyl ether | 270 |

Examples 6-16

Comparative Example CE1

Preparation of Conductive Paste Composition Containing Polymers and Microgels

Unless otherwise specified, the conductive paste compositions of Examples 6-16 may be prepared in the following general manner, using formulations set forth in Table II. The requisite amounts (g) of polymer solution/dispersion (as prepared in Example 5 and listed in Table I), solvent, thixotrope, and surfactant indicated for each example are weighed, then mixed in a suitable mixer to form an organic vehicle. In most cases the resin is pre-dispersed beforehand in solvent at the indicated concentration by heating to a slightly elevated temperature with stirring and then cooled to room temperature, as described in Example 5. The inorganic solids, i.e. glass frit, silver powder, and frit additive in the indicated amounts, are added and further mixed in the mixer to form a paste composition. The glass frit used is a Pb—Te—O based frit, but other leaded and lead-free frits might also be used. Since the silver powder is the major part of the solids of the paste composition, it is ordinarily added incrementally, with mixing after each addition to ensure better wetting. For example, a planetary, centrifugal Thinky® mixer (available from Thinky® USA, Inc., Laguna Hills, Calif.) would be suitable. Each of the foregoing mixing steps might be carried out in a Thinky® mixer at 2000 rpm for 30 s.

After being well mixed, the paste composition is repeatedly passed through a three-roll mill with a 25 μm gap at pressures that are progressively increased from 0 to 400 psi (~2.76 MPa). A suitable mill is available from Charles Ross and Son, Hauppauge, N.Y.

If more than one type of silver powder is to be used in the recipe, the silver with the smaller $d_{50}$ is preferably incorporated first. This sample is then roll milled before the silver powder(s) with larger $d_{50}$ is incorporated. After the second silver powder is added, the final paste composition is milled again with the same mill parameters.

The degree of dispersion of each paste composition may be measured using commercial fineness of grind (FOG) gages (e.g., gages available from Precision Gage and Tool, Dayton, Ohio) in accordance with ASTM Standard Test Method D 1210-05, which is promulgated by ASTM International, West Conshohocken, Pa., and is incorporated herein by reference. The resulting data are ordinarily expressed as FOG values represented as X/Y, meaning that the size of the largest particle detected is X μm and the median size is Y μm. In an embodiment, the FOG values of the present paste compositions are typically 20/10 or less, which has been found to be ordinarily sufficient for good printability.

Ordinarily, the processed paste composition is adjusted prior to printing by adding a small of solvent as required to obtain a viscosity suitable for screen printing fine lines. Viscosity values may be obtained using a Brookfield viscometer (Brookfield Inc., Middleboro, Mass.) with a #14 spindle and a #6 cup. Typically, a final viscosity of about 300 Pa·s (measured at 10 rpm/3 min) is found to yield good screen printing results, but some variation, for example ±50 Pa·s or more, would be acceptable, depending on the precise printing apparatus and parameters.

Table II also lists a value for formulated solids, which may be calculated from the aggregate of the silver powder, glass frit, and any frit additives included, or measured by ashing the formulated paste composition.

TABLE II

Conductive Paste Compositions

| Ingredient | CE-1 | EX-6 | EX-7 | EX-8 | EX-9 | EX-10 | EX-11 | EX-12 | EX-13 | EX-14 | EX-15 | EX-16 |
|---|---|---|---|---|---|---|---|---|---|---|---|---|
| P1 | 0.2 | 0.2 | — | — | — | — | — | — | — | — | — | — |
| P2 | 0.08 | 0.08 | — | — | — | — | — | — | — | — | — | — |
| P3 | 0.765 | — | — | — | — | — | — | — | — | — | — | — |
| P4 | — | 0.765 | 2.855 | 3.045 | 2.855 | 3.045 | 3.045 | — | — | — | — | — |
| P5 | — | — | — | — | — | — | — | 3.51 | 3.425 | 3.425 | — | — |
| P13 | — | — | — | — | — | — | — | — | — | — | 3.38 | — |
| P14 | — | — | — | — | — | — | — | — | — | — | — | 2.77 |
| Surfactant | 0.25 | 0.25 | 0.05 | 0.05 | 0.15 | 0.15 | 0.25 | — | 0.055 | 0.15 | 0.06 | 0.06 |
| Thixotrope | 0.31 | 0.31 | 0.215 | 0.355 | 0.355 | 0.355 | 0.355 | 0.10 | 0.20 | 0.30 | 0.2 | 0.2 |
| Solvent | 2.37 | 2.11 | 0.75 | 1.25 | 0.75 | 0.75 | 0.75 | 0.82 | 1.34 | 0.50 | 1.1 | 1.3 |
| Frit additive | 0.035 | 0.035 | 0.035 | 0.035 | 0.035 | 0.035 | 0.035 | 0.035 | 0.035 | 0.035 | 0.035 | 0.035 |
| Glass Frit | 0.70 | 0.70 | 0.70 | 0.70 | 0.70 | 0.70 | 0.70 | 0.70 | 0.70 | 0.70 | 0.7 | 0.7 |
| Silver Ag-A | 44.9 | 44.9 | 44.9 | 44.9 | 44.9 | 44.9 | 44.9 | 44.9 | 44.9 | 44.9 | 44.9 | 44.9 |
| Formulated solids (%) | 90.8 | 90.9 | 91.5 | 89.8 | 90.6 | 90.2 | 90.3 | 90.1 | 89.4 | 89.1 | 90.3 | 90.3 |
| viscosity @10 rpm (Pa · s) | 302 | 309 | 300 | 297 | 345 | 314 | 317 | 349 | 276 | 332 | 336 | 348 |

Example 17

Line Spreading Characterization

The paste compositions of Examples 6-16 and Comparative Example CE1 are screen printed to provide a conductive structure on six inch square Inventec multicrystalline p-type silicon wafers using a Dynamesh 360/16 screen with 15 μm emulsion thickness and a plurality of 35-μm wide fingers that extend from three wider bus bars.

The printed paste composition is then dried, e.g. in a forced-air convection oven at 150° C. for 10 min or by passing the printed wafers through a multizone belt furnace having a peak temperature set point of 350° C. After drying, the wafers are fired by passing them through a multizone belt furnace having a suitable peak temperature set point. This heating causes the organic constituents of the paste composition to be pyrolized or otherwise removed, and further causes the silver powder to sinter and adhere to the underlying silicon substrate, thereby producing a finished conductive structure. In an embodiment a peak temperature set point may be 885° C. to 930° C. in the hottest zone, depending on the specific printing parameters and the paste composition.

Line dimensions in the finger portion of the conductive structure are determined with a LaserTec H1200 Confocal microscope. A step and repeat program is used to obtain 30 measurements of printed finger dimensions across the area of the wafers. An overall average is calculated from the 30 individual measurements to obtain average line dimensions for each particular test condition. Line dimensions of the fingers may be obtained on as-printed wafers, after the paste drying step, and after the firing step. The line spreading behavior as thus measured is set forth in Table III for electrodes made on Si wafers with the paste compositions of Example 6 and Comparative Example CE1.

TABLE III

| Line Dimensions of Printed Conductive Lines | | |
|---|---|---|
| Property | Ex-6 | CE1 |
| Viscosity (Pa · s) | 309 | 302 |
| Line width before firing (μm) | 44.7 | 48.1 |
| Line width after firing (μm) | 42.4 | 44.8 |
| Line height after firing (μm) | 12.2 | 11.3 |
| Aspect ratio after firing | 0.288 | 0.252 |

Example 18

Solar Cell Electrical Characterization

The electrical performance of solar cells employing front-side electrodes fabricated as described in Example 17 is provided. Measurements of light conversion efficiencies are characterized using a suitable test apparatus, such as a Berger Photovoltaic Cell Tester. A Xe Arc lamp in the tester simulates sunlight with a known intensity of 1 sun and irradiates the front surface of the cell. The tester uses a four contact method to measure current (I) and voltage (V) at approximately 400 load resistance settings to determine the cell's I-V curve. Both fill factor (FF) and efficiency (Eff) are calculated from the I-V curve with normalization to corresponding values obtained with cells contacted with industry standards. Full plane, back side electrodes are prepared with commercially available paste compositions, such as Solamet® PV381 aluminum paste for the p-type conductor and Solamet® PV502 as the rear surface tabbing silver composition. The Solamet® pastes are available from E. I. DuPont de Nemours and Company, Wilmington, Del., while the PASE-1206 paste is available commercially from Monocrystal, Stavropo, Russia.

For each composition, cells are fired at a series of peak set point temperatures. Electrical data obtained at the best temperature are set forth in Table IV for cells prepared using the paste compositions of Examples 6 and 12-16. Data for cells made with the paste composition of of Comparative Example CE1 (taken under two different firing conditions) are also provided.

TABLE IV

| Electrical data at best firing condition for photovoltaic cells | | | | | | | | |
|---|---|---|---|---|---|---|---|---|
| Property | CE-1 | CE-1 | EX-6 | EX-12 | EX-13 | EX-14 | EX-15 | EX-16 |
| best firing temp. (° C.) | 915 | 930 | 915 | 930 | 930 | 930 | 915 | 915 |
| EFF (%) | 17.87 | 17.89 | 17.94 | 17.99 | 17.98 | 17.93 | 17.98 | 17.34 |
| Isc (A) | 8.772 | 8.745 | 8.808 | 8.750 | 8.754 | 8.742 | 8.861 | 8.850 |
| Fill Factor (%) | 78.64 | 78.68 | 78.63 | 78.92 | 78.88 | 78.82 | 78.85 | 75.47 |
| VOC (V) | 0.630 | 0.633 | 0.632 | 0.636 | 0.635 | 0.634 | 0.633 | 0.631 |
| Rs (Ω) | 0.621 | 0.682 | 0.642 | 0.682 | 0.701 | 0.684 | 0.696 | 0.974 |

Example 19

Line Printability Characterization

The ability of the present paste compositions to resolve fine lines is determined by printing using a Murakami 360/16 variable-width screen with a 15 μm emulsion thickness and plural fingers ranging in width from 40 to 20 μm in 5 μm intervals. The variable width design is repeated four times across the area of a 6" (~150 mm) square pattern. Pastes are printed on Si wafers and fired according to the methods described above. Line integrity is judged using electroluminescence images of the printed and fired wafers. Pastes are deemed capable of resolving fine lines if the 40 μm lines in the variable width pattern are resolved as determined by visual inspection of the electroluminescence images. A summary of fine line printability results for the pastes of Examples 7 to 11 and Comparative Example CE1 is detailed in Table V.

TABLE V

| Fine line printability of paste compositions | | | | | |
|---|---|---|---|---|---|
| Paste | line resolution | | | | |
| Composition | 40 μm | 35 μm | 30 μm | 25 μm | 20 μm |
| CE-1 | yes | yes | no | no | no |
| EX-7 | yes | partial | no | no | no |
| EX-8 | yes | partial | no | no | no |
| EX-9 | yes | yes | partial | no | no |
| EX-10 | yes | yes | partial | no | no |
| EX-11 | yes | yes | yes | no | no |

Examples 20-24

Preparation of Microgel-Containing Conductive Paste Compositions

Microgel-containing conductive paste compositions are prepared using processes similar to those described in Examples 6-16 above. A dispersion of BzMA microgel in solvent (as prepared in Example 5) or i-BMA is prepared, and for Examples 21-24 is further combined with a Thixatrol MAX® thixotrope and a Duomeen TDO® surfactant, in the proportions (g) set forth in Table VI (amounts in g). This organic vehicle is then incrementally mixed with precombined inorganics containing Ag-A, Pb—Te—O glass frit, and $LiRuO_3$ frit additive to form a paste composition. Additional solvent is added, as needed to obtain a viscosity suitable for screen printing. The particle dispersion is characterized to determine fineness of grind.

TABLE VI

| Conductive Paste Compositions | | | | | |
|---|---|---|---|---|---|
| Ingredient | EX-20 | EX-21 | EX-22 | EX-23 | EX-24 |
| P5 BzMA | 3.531 | 3.551 | 3.500 | 2.322 | — |
| P7 i-BMA | — | — | — | — | 3.480 |
| wt % microgel in dispersion | 15 | 10 | 10 | 15 | 15 |
| Surfactant | — | — | 0.055 | 0.085 | 0.171 |
| Thixotrope | — | 0.103 | 0.347 | 0.345 | 0.096 |
| Dibenzyl ether | 0.906 | 0.464 | 0.884 | — | 0.707 |

TABLE VI-continued

| Conductive Paste Compositions | | | | | |
|---|---|---|---|---|---|
| Ingredient | EX-20 | EX-21 | EX-22 | EX-23 | EX-24 |
| TEX/BCA (1:1 wt) | — | — | — | 1.503 | — |
| Frit additive | 0.037 | 0.034 | 0.036 | 0.036 | 0.037 |
| Glass Frit | 0.76 | 0.769 | 0.747 | 0.748 | 0.748 |
| Silver Ag-A | 45.068 | 45.275 | 45.027 | 45.074 | 45.046 |
| Solvent holdback | 0.329 | 0.360 | 0.766 | 0.401 | 0.319 |
| FOG (μm/μm) | 10/2 | 15/2 | 20/3 | 10/2 | 7/2 |
| viscosity @10 rpm (Pa · s) | 248 | 308 | 237 | 178 | 258 |
| viscosity @50 rpm (Pa · s) | 74 | 94 | 139 | 83 | 86 |

Example 25

Screen Printing of Microgel-Containing Conductive Paste Compositions

The paste compositions prepared in Examples 20-24 are screen printed onto the front side of crystalline silicon wafers using an AMI-Presco (AMI, North Branch, N.J.) MSP-485 semi-automatic screen printer. The wafers are obtained from E-Ton Solar Tech Corporation, Tainan Township, Taiwan and are appointed for the construction of p-type photovoltaic cells, with a boron-doped, p-type base and a highly phosphorus-doped front-side emitter yielding about 65 Ω/sq. surface resistivity.

A conductive structure is formed on each wafer in a comb-like pattern comprising 18 fingers (pitch~0.20 cm) extending perpendicularly from a bus bar. The printing screen used has an opening~30 μm wide in the finger region.

Figure 2:
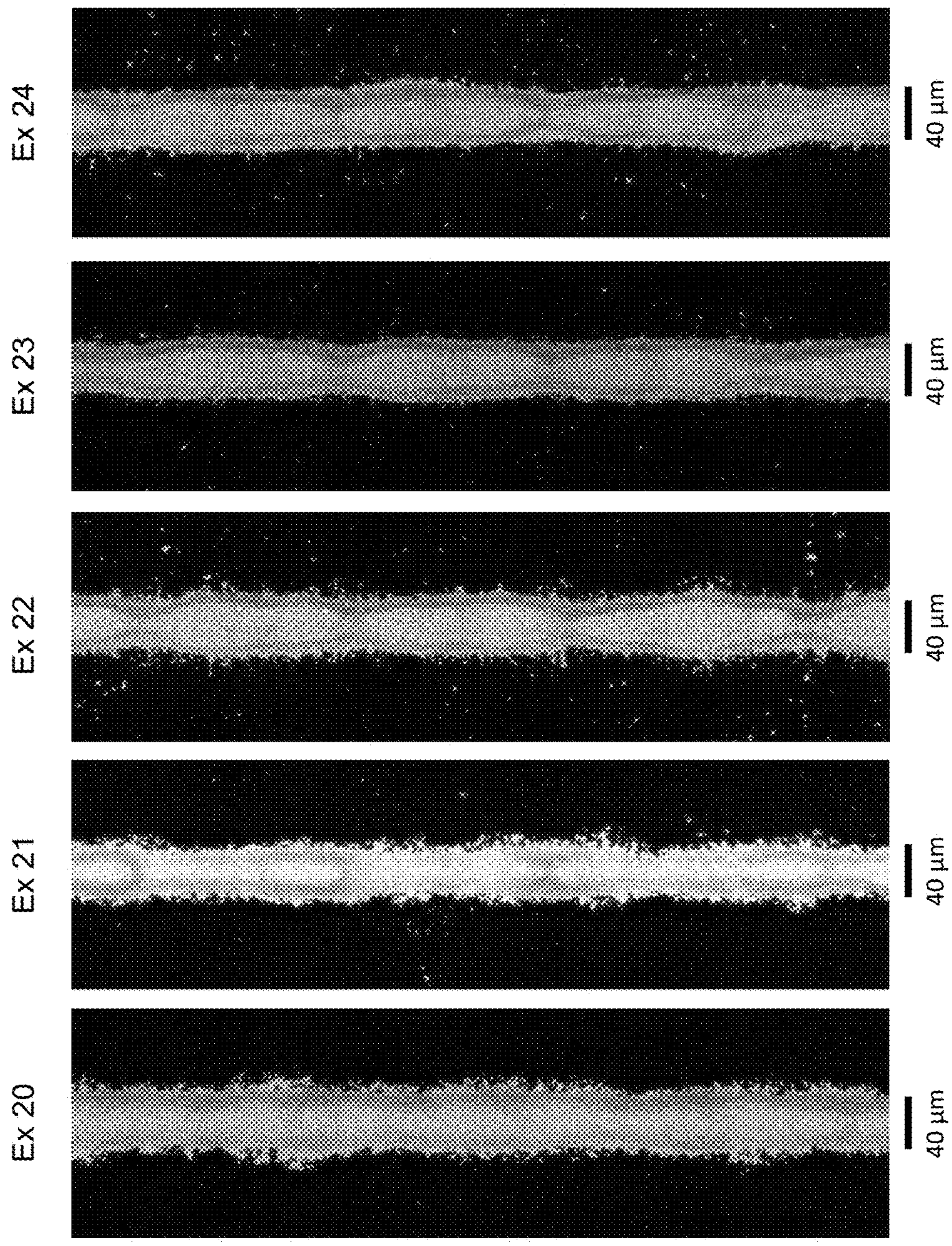
FIG. 2 is an optical micrograph of fine conductor lines printed using the present paste composition.

Optical micrographs showing a portion of the finger section in each structure are set forth in FIG. 2, demonstrating that fine lines can be printed using each of the Example 20-24 pastes.

Examples 26-33

Preparation of Conductive Paste Composition Containing Microgels

Another series of microgel-containing conductive paste compositions is prepared using processes similar to those described in Examples 6-16 and 20-24 above. A dispersion of either BMA/MMA/UMA or BMA/MMA microgel in solvent (as prepared in Example 4) is prepared, except that for Examples 32-33, the microgel dispersions are prepared with 4.0 wt % of the EGDMA cross-linker instead of the 0.25% used in the others. For Examples 28-33, the microgel dispersion is further combined with a surfactant as indicated and a Thixatrol MAX® thixotrope, in the proportions set forth in Table VII. This organic vehicle is then incrementally mixed with the precombined inorganics containing silver powder, glass frit, and $LiRuO_3$ frit additive to form a paste composition. Additional solvent is added, as needed to obtain a viscosity suitable for screen printing.

TABLE VII

| Conductive Paste Compositions | | | | | | | | |
|---|---|---|---|---|---|---|---|---|
| Ingredient | EX-26 | EX-27 | EX-28 | EX-29 | EX-30 | EX-31 | EX-32 | EX-33 |
| P4 BMA/MMA/UMA | 4.16 | | 3.00 | 2.335 | 2.335 | 2.335 | 2.35 | |
| P6 BMA/MMA | | 4.16 | | | | | | 2.35 |
| EGDMA (wt % in dispersion) | 0.25 | 0.25 | 0.25 | 0.25 | 0.25 | 0.25 | 4.0 | 4.0 |
| wt % microgel in dispersion | 15 | 15 | 15 | 15 | 15 | 15 | 15 | 15 |
| Duomeen ® TDO | | | 0.05 | 0.15 | | | 0.153 | 0.153 |
| Stearic acid | | | | | 0.15 | | | |
| Tween ® 20 | | | | | | 0.15 | | |
| Thixotrope | | | 0.35 | 0.35 | 0.35 | 0.35 | 0.358 | 0.358 |
| Benzyl benzoate | | 1.805 | | | | | | |
| TEX/BCA (1:1 wt) | 0.28 | | | | | | | |
| BCA | | | 2.08 | 2.08 | 2.08 | 2.08 | 1.935 | 2.065 |
| Frit additive | 0.035 | 0.035 | 0.035 | 0.035 | 0.035 | 0.035 | 0.035 | 0.035 |
| Glass Frit | 0.805 | 0.805 | 0.805 | 0.805 | 0.805 | 0.805 | 0.805 | 0.805 |
| Silver Ag-B | | 45.0 | | | | | | |
| Silver Ag-A | 45.0 | | 45.0 | 45.0 | 45.0 | 45.0 | 45.0 | 45.0 |
| formulated solids (%) | 91.16 | 88.49 | 89.30 | 90.2 | | | 90.53 | 90.3 |
| viscosity @10 rpm (Pa · s) | 281 | 328 | 232 | 232 | | | 157 | 188 |
| viscosity @10 rpm (Pa · s) | 74 | 84 | 76 | 76 | | | 90 | 96 |

For convenience, the printing is carried out using ~28 mm×28 mm “cut down” wafers prepared by dicing large starting wafers (e.g. ~156 mm×156 mm square wafers, ~200 μm thick) with a diamond blade saw, unless otherwise indicated. Electrical performance of such 28 mm×28 mm cells is known to be impacted by edge effects, which typically reduce the overall photovoltaic cell efficiency by as much as ~1 to 3% from what would be obtained with full-size wafers. A conventionally applied $SiN_x$:H antireflective coating (ARC) is present on the front (sun-facing) major surface of the wafers.

Example 34

Solar Cell Fabrication and Electrical Characterization

Using processes comparable to those set forth in Example 25 above, the conductive paste compositions of Examples 26-33 are screen printed on the front, P-doped emitter of p-base type silicon solar cell wafers and dried and fired to form conductive structures comprising a bus bar and plural fine line fingers extending therefrom. The resulting solar cells are tested using a standard solar cell testing apparatus and found to exhibit high light conversion efficiency.

Examples 35-39

Preparation of Conductive Paste Composition Containing Microgels

As set forth in Table VIII below, a series of microgel-containing, conductive paste compositions are prepared as Examples 35-39 using processes described in Examples 6-16, 20-24, and 26-33 above, with the amounts indicated by weight percent. A small amount of solvent is held back, to permit adjustment of the viscosity to a level suitable for screen printing. The viscosities of the compositions, measured under the two conditions indicated are also reported. The difference is indicative of good shear thinning.

Paste compositions comprising BMA/MMA/UMA microgels made with either 2 wt % or 4 wt % of EGDMA crosslinker are prepared as Examples 41-46, which are set forth in Table IX. The amounts of solvent are also varied in these formulations.

The paste compositions of Examples 41-46 are used to prepare front-side electrodes for photovoltaic cells fabricated on Solartech multicrystalline wafers. The paste composition is applied on the wafers using a Microtec semi-automated screen printer with a Murakami screen having 110 finger lines 35 μm wide depending from 3 larger busbars. Back side electrodes are formed by screen printing a full aluminum back plane using PASE-1206 aluminum-based metallization paste, which is available commercially from Monocrystal, Stavropol, Russia. After printing the deposited paste composition is dried in a box oven. The wafers are fired by passing them through a multizone Despatch furnace, wherein the peak setpoint temperature is 885° C.-930° C. Cells are also fabricated using the paste composition of Comparative Example CE2. Electrical properties of these cells after firing are obtained as described above in Example 18, yielding the data also shown in Table IX.

TABLE VIII

Conductive Paste Compositions

| Constituent | Detail | Example 35 | 36 | 37 | 38 | 39 |
|---|---|---|---|---|---|---|
| microgel | BMA/MMA/UMA (Ex. 2) | 5.71 | 6.09 | 5.71 | 6.09 | 6.09 |
| surfactant | Duomeen ® TDO | 0.10 | 0.10 | 0.30 | 0.30 | 0.50 |
| thixotrope | Thixatrol ® MAX | 0.43 | 0.71 | 0.71 | 0.71 | 0.71 |
| solvent | BCA | 1.50 | 2.50 | 1.50 | 1.50 | 1.50 |
| frit additive | $LiRuO_3$ | 0.07 | 0.07 | 0.07 | 0.07 | 0.07 |
| glass frit | Pb-Te-O based | 1.40 | 1.40 | 1.40 | 1.40 | 1.40 |
| conductive metal | Ag-A | 90.00 | 90.00 | 90.00 | 90.00 | 90.00 |
| TOTAL | | 99.21 | 100.87 | 99.69 | 100.07 | 100.27 |
| solvent holdback | BCA | 0.13 | 0.18 | 0.15 | 0.18 | 0.11 |
| viscosity | 10 rpm/3 min | 300 | 297 | 345 | 314 | 317 |
| viscosity | 50 rpm/6 min | 74.8 | 88.4 | 97.4 | 84.2 | 92.4 |

Example 40

Solar Cell Fabrication and Electrical Characterization

The paste compositions of Examples 35-39 are screen printed onto the front surface of silicon wafers appointed for the fabrication of p-type solar cells. All result in the deposition of fine lines (40 μm or narrower) that can be fired to produce conductive structures that function as solar cell electrodes. Cells thus fabricated exhibit high energy conversion efficiency.

Examples 41-46

Comparative Example CE2

Preparation and Testing of Conductive Paste Compositions Containing Microgel Compositions with Different Crosslinker Amounts

TABLE IX

Conductive Paste Compositions and Electrical Characterization

| Ingredient | Example CE2 | EX-41 | EX-42 | EX-43 | EX-44 | EX-45 | EX-46 |
|---|---|---|---|---|---|---|---|
| P1 | 0.4 | | | | | | |
| P2 | 0.16 | | | | | | |
| P3 | 1.53 | | | | | | |
| P8 | | 2.6 | 3.6 | 4.4 | 5 | | |
| P9 | | | | | | 3 | 4.5 |
| Duomeen ® TDO | 0.5 | 0.5 | 0.5 | 0.5 | 0.5 | 0.5 | 0.5 |
| Thixatrol ® MAX | 0.65 | 0.6 | 0.6 | 0.6 | 0.6 | 0.6 | 0.6 |
| DBE-3 | 0.96 | | | | | | |
| TEX | 1.7 | 1 | 0.5 | 0.1 | 0.1 | 0.8 | 0.05 |
| BCA | 1.54 | 3 | 2.5 | 2.1 | 1.5 | 2.8 | 2.05 |
| Frit additive | 0.07 | 0.04 | 0.04 | 0.04 | 0.04 | 0.04 | 0.04 |

TABLE IX-continued

Conductive Paste Compositions and Electrical Characterization

| | Example | | | | | | |
|---|---|---|---|---|---|---|---|
| Ingredient | CE2 | EX-41 | EX-42 | EX-43 | EX-44 | EX-45 | EX-46 |
| Glass Frit | 1.5 | 1.8 | 1.8 | 1.8 | 1.8 | 1.8 | 1.8 |
| Silver Ag-A | 78.79 | 90 | 90 | 90 | 90 | 90 | 90 |
| Silver Ag-D | 11.12 | | | | | | |
| formulated solids (%) | 90.59 | 90.13 | 89.95 | 90.19 | 89.98 | 90.11 | 89.92 |
| viscosity @10 rpm (Pa · s) | 438 | 264 | 305 | 319 | 325 | 253 | 271 |
| viscosity @50 rpm (Pa · s) | 126.8 | 109.2 | 115.8 | 99.6 | 98.6 | 114.8 | 84 |
| Fired line width (μm) | 61.8 | 64.4 | 76.9 | 54.7 | 55.8 | 54.4 | 55.5 |
| Efficiency (%) | 17.43 | 17.54 | 17.55 | 17.56 | 17.45 | 17.3 | 17.65 |
| Isc (A) | 8.73 | 8.76 | 8.75 | 8.75 | 8.78 | 8.77 | 8.79 |
| Voc(V) | 0.626 | 0.628 | 0.629 | 0.628 | 0.627 | 0.629 | 0.628 |

Examples 47-48

Comparative Example CE3

Preparation and Testing of Conductive Paste Compositions Containing Multiple Microgels Paste compositions containing a plurality of microgels having different compositions were prepared as Examples 47-48, as set forth in Table X.

TABLE X

Conductive Paste Compositions

| Ingredient | EX-47 | EX-48 |
|---|---|---|
| P4 | 1.12 | 1.68 |
| P10 | 1.44 | 2.16 |
| Duomeen ® TDO | 0.32 | 0.32 |
| Thixatrol ® MAX | 0.48 | 0.48 |
| TEX | 0.72 | 0.13 |
| BCA | 2.40 | 1.70 |
| Frit additive | 0.03 | 0.03 |
| Glass Frit | 1.8 | 1.8 |
| Silver Ag—C | 91.20 | 91.20 |
| formulated solids (%) | 92.35 | 91.71 |
| viscosity @10 rpm (Pa · s) | 249 | 295 |
| viscosity @50 rpm (Pa · s) | 158 | 124 |

The paste compositions of Examples 47-48 are used to prepare front-side electrodes for photovoltaic cells fabricated on Solar Tech multicrystalline wafers using the procedure described above for Examples 41-46, except that the drying after paste deposition is carried out in an UltraFlex IR belt furnace. Cells are also fabricated for Comparative Example CE3 using another batch of the paste composition of Comparative Example CE1. Electrical properties of these cells after firing are obtained as described above in Example 41-46, yielding the data shown in Table XI.

TABLE XI

Solar Cell Electrical Characterization

| | Example | | |
|---|---|---|---|
| Property | EX-47 | EX-48 | CE3 |
| Efficiency (%) | 17.99 | 18.0 | 17.93 |
| Isc (A) | 8.80 | 8.81 | 8.80 |
| Voc (V) | 0.630 | 0.631 | 0.630 |
| FF (%) | 79.02 | 78.86 | 78.64 |

Examples 49-51

Preparation and Testing of Microgel Conductive Paste Compositions

Paste compositions comprising BMA/MMA/UMA microgels are prepared as Examples 49-51. Microgel emulsion polymers are first made as described in Examples 2 and 4 above, with 0.25 wt % and 4 wt % of EGDMA crosslinker. Suspensions of these polymers in a 1:1 mixture of Texanol and BCA solvents (at 15 and 20 wt % polymer, respectively) are prepared as in Example 5 and then combined with the remaining ingredients, in the amounts (g) set forth in Table XII, using techniques described generally in Examples 6-16 above.

TABLE XII

Conductive Paste Compositions

| Ingredient | EX-49 | EX-50 | EX-51 |
|---|---|---|---|
| BMA/MMA/UMA/EGDMA (4 wt %) | 2.35 | 2.20 | 1.00 |
| BMA/MMA/UMA/EGDMA (0.25 wt %) | — | 0.60 | — |
| Duomeen ® TDO | 0.153 | 0.25 | 0.15 |
| Thixatrol ® MAX | 0.358 | 0.329 | 0.350 |
| BCA | 1.94 | 1.60 | 2.80 |
| Frit additive | 0.35 | 0.35 | 0.17 |
| Glass Frit | 0.805 | 0.805 | 0.72 |
| Silver Ag-A | 45.0 | 45.0 | 33.75 |
| Silver Ag—C | — | — | 11.25 |
| Calculated formulated solids (%) | 90.52 | 90.2 | 91.6 |

The paste compositions of Examples 49-51 are screen printed onto monocrystalline silicon wafers using a process as set forth in Example 25 above. It is found that the paste compositions of Examples 49 and 50 exhibit excellent shear-thinning rheological behavior and are readily screen-printed through a screen with 30 μm wide line openings, producing good quality, narrow deposited traces that are about 38 and 40 μm wide, respectively, after printing but before firing. The Example 51 paste composition, with lower microgel content, exhibits shear thinning only to a lesser extent, and is more difficult to print, producing deposited lines showing some line breaks.

Having thus described the invention in rather full detail, it will be understood that this detail need not be strictly adhered to but that further changes and modifications may suggest themselves to one skilled in the art, all falling within the scope of the invention as defined by the subjoined claims.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

It should be understood that in some instances herein, polymers (including ones prepared as microgels) are described by referring to the monomers or the amounts thereof used to produce the polymers. While such a description may not include the specific nomenclature used to describe the final polymer or may not contain product-by-process terminology, any such reference to monomers and amounts should be interpreted to mean that the polymer comprises those monomers (i.e. copolymerized units of those monomers) or that amount of the monomers, and the corresponding polymers and compositions thereof.

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value; and (b) all numerical quantities of parts, percentage, or ratio are given as parts, percentage, or ratio by weight; the stated parts, percentage, or ratio by weight may or may not add up to 100.

What is claimed is:

1. A paste composition comprising:

(a) a source of electrically conductive metal;

(b) 0.25 to 8 wt % of a glass frit, based on the total weight of the paste composition; and (c) an organic vehicle in which the source of electrically conductive metal and the glass frit are dispersed, the organic vehicle comprising organic polymer material and a solvent, wherein the organic polymer material comprises microgel particles having polymer units with molecular weights ranging from more than $10^7$ to $10^{12}$ and, optionally, one or more additional polymeric materials, with a total amount of the organic polymer material ranging from 0.01 to 5.0 wt %, based on the total weight of the paste composition.

2. The paste composition of claim 1, wherein the microgel particles comprise polymer units polymerized from one or more acrylate or methacrylate monomers or a mixture thereof.

3. The paste composition of claim 2, wherein the one or more monomers comprise one or more of ethyl acrylate, methyl acrylate, methyl methacrylate, n-butyl methacrylate, iso-butyl methacrylate, benzyl methacrylate, styrene, or 2-(2-Oxo-1-imidazolidinyl)ethyl methacrylate, or a mixture thereof in any proportion.

4. The paste composition of claim 3, wherein the one or more monomers comprise one or more of methyl methacrylate or n-butyl methacrylate, or a mixture thereof in any proportion.

5. The paste composition of claim 3, wherein the one or more monomers comprise one or more of methyl methacrylate, n-butyl methacrylate, or 2-(2-Oxo-1-imidazolidinyl) ethyl methacrylate, or a mixture thereof in any proportion.

6. The paste composition of claim 3, wherein the one or more monomers comprise benzyl methacrylate.

7. The paste composition of claim 1, wherein the microgel particles are of a plurality of types which differ in at least one of composition or median particle size.

8. The paste composition of claim 7, wherein the microgel particles are of two types.

9. The paste composition of claim 7, wherein the plurality of types respectively comprise polymer units polymerized from different monomers or from different combinations of monomers.

10. A photovoltaic cell formed on a semiconductor wafer having opposed first and second major surfaces and comprising first and second electrodes, the first electrode being situated on the first major surface and formed by a firing operation that establishes electrical contact between the electrode and the semiconductor wafer, and wherein, prior to the firing operation, the first electrode is comprised of the paste composition recited by claim 1.

11. A semiconductor substrate having opposed first and second major surfaces and comprising:

a. an antireflective coating on the first major surface;

b. the paste composition recited by claim 1 being deposited onto a preselected portion of the first major surface and configured to be formed by a firing operation into a conductive structure in electrical contact with the semiconductor substrate.

12. The paste composition of claim 1, wherein the source of electrically conductive metal is a metal powder that comprises at least 80% by weight of the paste composition.

13. The paste composition of claim 1, wherein the organic polymer material comprises microgel particles having a size ranging from 20 nm to 2 μm.

14. The paste composition of claim 1, wherein a cross-linker is present in the microgel particles in an amount ranging from 0.1% to 8% based on the weight of the total monomer.

15. The paste composition of claim 1, wherein the microgel particles comprise polymer units having molecular weights ranging from $10^8$ to $10^{12}$.

16. The semiconductor substrate of claim 11, wherein the paste composition is capable of firing through the antireflective coating during the firing operation such that an electrical connection is established between the conductive structure and the semiconductor substrate.

17. The paste composition of claim 12, wherein the source of electrically conductive metal is a metal powder that comprises at least 85% by weight of the paste composition.

18. The paste composition of claim 1, being capable of being used in forming an electrical connection in a photovoltaic device comprising a semiconductor substrate having at least one insulating layer on a main surface thereof, such that when fired, the paste composition is capable of penetrating the at least one insulating layer.

19. The paste composition of claim 1, wherein a viscosity of the paste composition has a value that renders it capable of being screen printed to form fine lines having a width of 10 to less than 50 μm.

20. The paste composition of claim 1, having a viscosity of 250 to 500 Pa·s measured at 25° C.

21. The paste composition of claim 1, wherein the microgel particles have a median size ranging from 20 nm to 0.8 μm.

22. The paste composition of claim 1, wherein a viscosity of the paste composition has a value that renders it capable of being screen printed to form fine lines having a width of 10 to 45 μm.

23. The paste composition of claim 1, being capable of use in forming an electrical connection in a photovoltaic device comprising a semiconductor substrate having at least one insulating layer on a main surface thereof, such that when fired, the composition penetrates the at least one insulating layer to form an electrical contact with the photovoltaic device, the contact comprising fine lines having a width of 10 to less than 50 μm.

* * * * *